(12) United States Patent
Nishikawa et al.

(10) Patent No.: US 9,318,207 B2
(45) Date of Patent: Apr. 19, 2016

(54) NONVOLATILE SEMICONDUCTOR MEMORY DEVICE AND METHOD OF OPERATING THE SAME

(71) Applicant: Kabushiki Kaisha Toshiba, Minato-ku (JP)

(72) Inventors: Kota Nishikawa, Yokohama (JP); Masanori Hatakeyama, Kawasaki (JP); Takanori Eto, Yokohama (JP); Atsuhiro Suzuki, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/569,850

(22) Filed: Dec. 15, 2014

(65) Prior Publication Data

US 2016/0049199 A1  Feb. 18, 2016

(30) Foreign Application Priority Data

Aug. 12, 2014 (JP) ................. 2014-164059

(51) Int. Cl.

| G11C 16/14 | (2006.01) |
|---|---|
| G11C 16/04 | (2006.01) |
| G11C 16/16 | (2006.01) |
| G11C 16/34 | (2006.01) |
| G11C 11/56 | (2006.01) |

(52) U.S. Cl.
CPC ............ *G11C 16/14* (2013.01); *G11C 16/0483* (2013.01); *G11C 16/3445* (2013.01); *G11C 11/5635* (2013.01); *G11C 16/0408* (2013.01)

(58) Field of Classification Search
CPC ............... G11C 16/14; G11C 16/0483; G11C 16/0408; G11C 11/5635
USPC ........................... 365/185.17, 185.18, 185.29
See application file for complete search history.

(56) References Cited

U.S. PATENT DOCUMENTS

| 7,079,437 | B2 | 7/2006 | Hazama et al. | |
|---|---|---|---|---|
| 7,397,706 | B2 | 7/2008 | Byeon et al. | |
| 7,907,463 | B2 | 3/2011 | Edahiro et al. | |
| 7,995,392 | B2 | 8/2011 | Shibata | |
| 2008/0056008 | A1* | 3/2008 | Aritome ............ | G11C 16/3418 365/185.24 |
| 2008/0159003 | A1* | 7/2008 | Dong ................. | G11C 11/5628 365/185.25 |
| 2008/0291735 | A1* | 11/2008 | Dong ................. | G11C 16/0483 365/185.19 |
| 2009/0303790 | A1* | 12/2009 | Fujimura ............... | G11C 16/16 365/185.03 |
| 2010/0008150 | A1* | 1/2010 | Hazama ............ | G11C 16/0483 365/185.22 |
| 2012/0002482 | A1* | 1/2012 | Franklin ................ | G11C 11/10 365/185.22 |
| 2012/0224427 | A1 | 9/2012 | Takekida | |
| 2015/0221380 | A1* | 8/2015 | Lee ......................... | G11C 16/10 365/185.11 |

FOREIGN PATENT DOCUMENTS

| JP | 2006-351168 | 12/2006 |
|---|---|---|
| JP | 2009-301616 | 12/2009 |
| JP | 2012-181890 | 9/2012 |

* cited by examiner

*Primary Examiner* — Ly D Pham
(74) *Attorney, Agent, or Firm* — Oblon, McClelland, Maier & Neustadt, L.L.P.

(57) ABSTRACT

A nonvolatile semiconductor memory device according to an embodiment comprises a control unit, during a data erase, applying at least to a word line connected to a memory cell disposed most to a source line side a lower control voltage than that applied to a word line connected to a memory cell disposed most to a bit line side, of a plurality of word lines connected to at least a plurality of memory cells mutually written with data of an identical number of bits in a cell string.

11 Claims, 10 Drawing Sheets

NONVOLATILE SEMICONDUCTOR MEMORY DEVICE AND METHOD OF OPERATING THE SAME

CROSS-REFERENCE TO RELATED APPLICATIONS

This application is based upon and claims the benefit of priority from the prior Japanese Patent Application No. 2014-164059, filed on Aug. 12, 2014, the entire contents of which are incorporated herein by reference.

FIELD

Embodiments relate to a nonvolatile semiconductor memory device and a method of operating the same.

BACKGROUND

In a data write of a NAND type nonvolatile semiconductor memory device, programs are normally performed in order from a memory cell disposed on a source line side. In this case, there is a risk that due to an order of the programs, variation of threshold voltages between memory cells ends up occurring and a threshold voltage distribution ends up broadening.

DETAILED DESCRIPTION

A nonvolatile semiconductor memory device according to an embodiment comprises: a cell array including a bit line, a plurality of word lines and a source line that intersect the bit line, and a cell string electrically connected between the bit line and the source line, the cell string including a plurality of memory cells connected to each other in series, each of the memory cells being configured from a transistor having a structure in which a charge accumulation layer and a control gate which is connected to one of the word lines are stacked on a semiconductor substrate via an insulating film; and a control unit that performs a data write/erase on the memory cell, the control unit, during the data erase, applying at least to the word line connected to the memory cell disposed most to a source line side a lower control voltage than that applied to the word line connected to the memory cell disposed most to a bit line side, of a plurality of the word lines connected to at least a plurality of the memory cells mutually written with data of an identical number of bits in the cell string.

Nonvolatile semiconductor memory devices and methods of operating the same according to embodiments will be described below with reference to the drawings.

First Embodiment

First, an overall configuration of a nonvolatile semiconductor memory device according to a first embodiment will be described.

Figure 1:
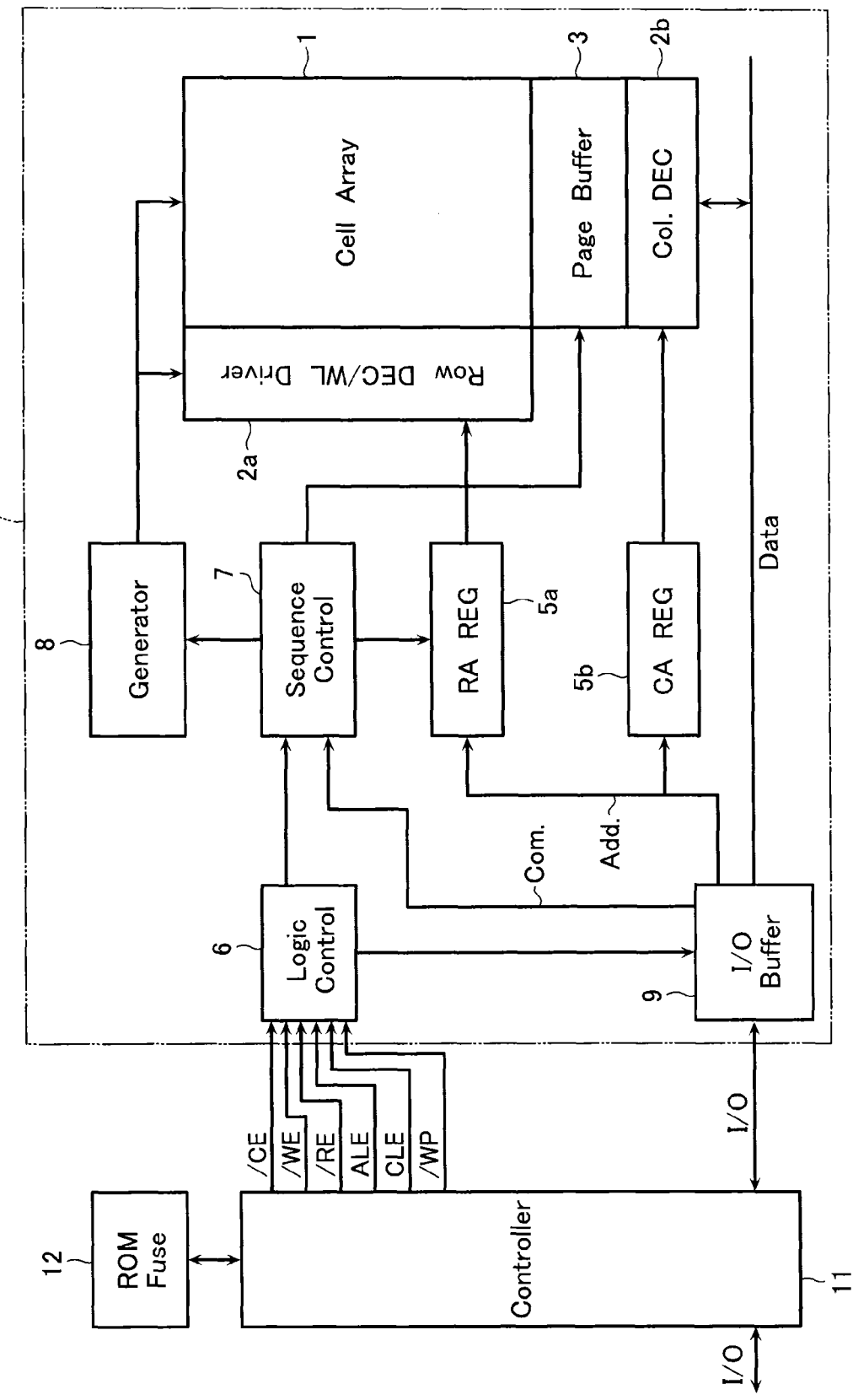
FIG. 1 is a functional block diagram of a nonvolatile semiconductor memory device according to a first embodiment.

FIG. 1 is a functional block diagram of the nonvolatile semiconductor memory device according to the present embodiment.

This nonvolatile semiconductor memory device is a NAND type flash memory and comprises: a NAND chip 10; a controller 11 that controls this NAND chip 10; and a ROM fuse 12 that stores various kinds of information required for access to the NAND chip 10.

The NAND chip 10 comprises a cell array 1. The cell array 1 includes a plurality of bit lines extending in a column direction, a plurality of word lines and a source line extending in a row direction, and a plurality of memory cells selected by the bit line and the word line. A group of memory cells selected by one word line configures a page. A data write/read of the flash memory is performed in a unit of the page. The cell array 1 will be described later.

In addition, the NAND chip 10 comprises a control unit that executes: a write sequence which is a series of processes for writing data to the memory cell; an erase sequence which is a series of processes for erasing data of the memory cell; and a read sequence which is a series of processes for reading data from the memory cell. The control unit includes: a row decoder/word line driver 2a; a column decoder 2b; a page buffer 3; a row address register 5a and column address register 5b; a logic control circuit 6; a sequence control circuit 7; a voltage generating circuit 8; and an I/O buffer 9.

The row decoder/word line driver 2a drives the word line and a later-to-be-described select gate line of the cell array 1. The page buffer 3 includes a one page portion of sense amplifier circuits and latch circuits. A one page portion of read data stored by the page buffer 3 is sequentially column selected by the column decoder 2b to be outputted to an external I/O terminal via the I/O buffer 9. Write data supplied from the I/O terminal is selected by the column decoder 2b to be loaded into the page buffer 3. The page buffer 3 is loaded with a one page portion of write data. Row and column address signals are inputted via the I/O buffer 9 and transferred to the row decoder 2a and column decoder 2b, respectively. The row address register 5a stores an erase block address in the case of a data erase, and stores a page address in the case of the data write/read. The column address register 5b is inputted with a leading column address for loading write data before start of the write sequence, or a leading column address for the read sequence. The column address register 5b stores the inputted column address until a write enable signal /WE or a read enable signal /RE is toggled by a certain condition.

The logic control circuit 6 controls input of a command or an address, and input/output of data, based on control signals such as a chip enable signal /CE, a command latch enable signal CLE, an address latch enable signal ALE, the write enable signal /WE, the read enable signal /RE, and a write protect signal /WP. The sequence control circuit 7 receives a command from the logic control circuit 6 and controls the write sequence, the erase sequence, and the read sequence based on this command. The voltage generating circuit 8 is controlled by the sequence control circuit 7 to generate certain voltages required for various operations.

The controller 11 controls the read sequence and the write sequence by conditions appropriate to a current write state of the NAND chip 10. Note that part of the read sequence and the write sequence may also be controlled by the control unit of the NAND chip 10.

Next, the cell array 1 will be described.

Figure 2:
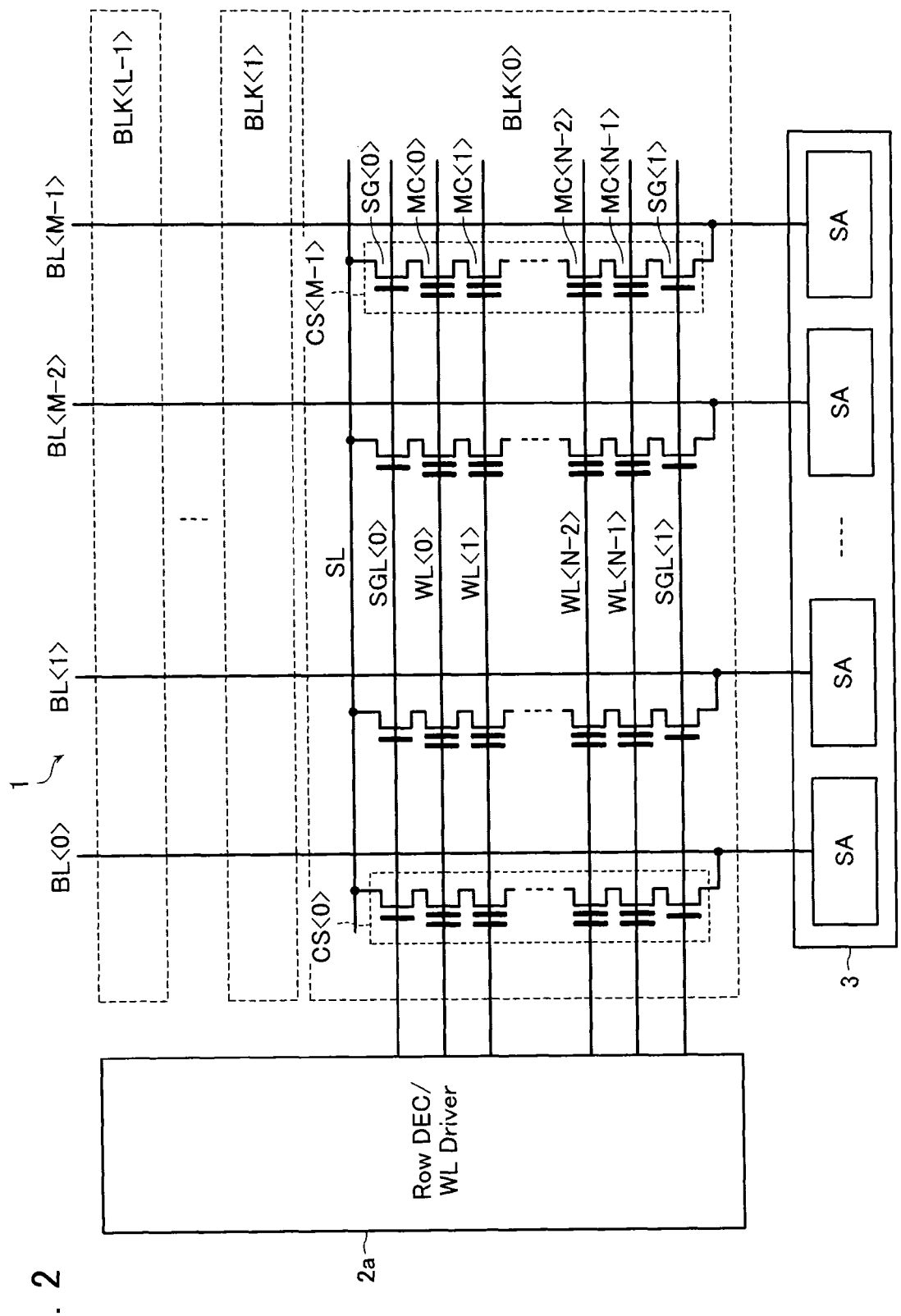
FIG. 2 is a circuit diagram of a cell array of the nonvolatile semiconductor memory device according to the same embodiment.

FIG. 2 is a circuit diagram of the cell array of the nonvolatile semiconductor memory device according to the present embodiment.

The cell array 1 includes: word lines WL<0> to WL<N−1>, select gate lines SGL<0> and SGL<1>, and a source line SL extending in the row direction; bit lines BL<0> to BL<M−1> extending in the column direction; and cell strings CS<0> to CS<M−1> provided corresponding to each of the bit lines BL<0> to BL<M−1>. Each of the cell strings CS includes N memory cells MC<0> to MC<N−1> connected in series, and select gates SG<0> and SG<1> connected to both ends of these series-connected memory cells MC. Each of the memory cells MC is configured from a transistor having a structure in which a floating gate, acting as a charge accumulation layer, and a control gate are stacked, via an insulating film, on a well (sometimes also referred to below as "cell well") of a semiconductor substrate. Moreover, the select gate SG is configured from a transistor having a structure in which a gate is stacked, via an insulating film, on a well of the semiconductor substrate. Note that a transistor having a structure similar to that of the memory cell MC can be utilized in the select gate SG, by short-circuiting the floating gate and the control gate.

A source of the select gate SG<0> is connected to the source line SL. A drain of the select gate SG<1> is connected to one of the bit lines BL<0> to BL<M−1>. Control gates of the memory cells MC<0> to MC<N−1> are connected to the word lines WL<0> to WL<N−1>. Gates of the select gates SG<0> and SG<1> are connected to the select gate lines SGL<0> and SGL<1>.

In the above-described configuration, the M cell strings CS aligned in the row direction configure one block BLK. The cell array 1 includes L blocks BLK<0> to BLK<L−1> aligned in the column direction. The data erase of the flash memory is performed in a unit of this block.

The word line WL and the select gate line SGL are driven by the row decoder 2a. Moreover, each of the bit lines BL is connected to a sense amplifier circuit SA of the page buffer 3.

Next, data storage of the memory cell MC will be described.

Figure 3:
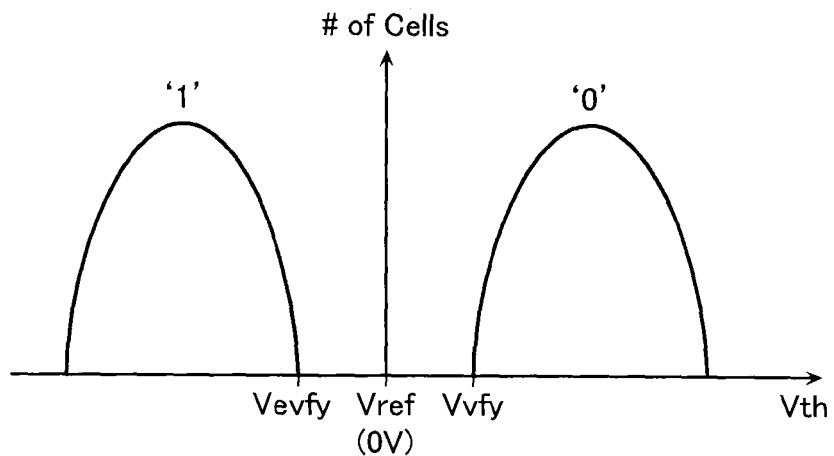
FIG. 3 is a view showing threshold voltage distributions of a memory cell of the nonvolatile semiconductor memory device according to the same embodiment.

FIG. 3 is a view showing threshold voltage distributions of the memory cell of the nonvolatile semiconductor memory device of the present embodiment. FIG. 3 shows the case of two values per cell.

The memory cell MC stores a plurality of data by a plurality of different threshold voltage distributions, in a nonvolatile manner. In the case of two values per cell, each of the memory cells has two threshold voltage distributions bounded by, for example, 0 V, and respectively allocates '1' data and '0' data to these two threshold voltage distributions to store the two values. A threshold voltage Vth of the memory cell MC is determined by the number of electrons stored by the floating gate. Hereafter, this number of electrons stored by the floating gate of the memory cell is sometimes also referred to simply as "number of stored electrons". Moreover, a state of the memory cell storing '1' data is sometimes also referred to as "erase state", and a state of the memory cell storing '0' data is sometimes also referred to as "program state".

It should be noted that although each of the embodiments will be described below assuming the case of two values per cell, each of the embodiments may be applied also in the case of three or more values per cell.

Hereafter, a method of operating the nonvolatile semiconductor memory device will be described.

As previously mentioned, the data write/erase/read on the memory cell is achieved by a series of processes called a sequence. The write sequence is configured from two operations, that is, a program operation and a program verify operation. The erase sequence is configured from an erase operation and an erase verify operation. The read sequence is configured from a read operation. Accordingly, each of the operations in these sequences will be described simply below.

First, the program operation of the present embodiment will be described.

Figure 4:
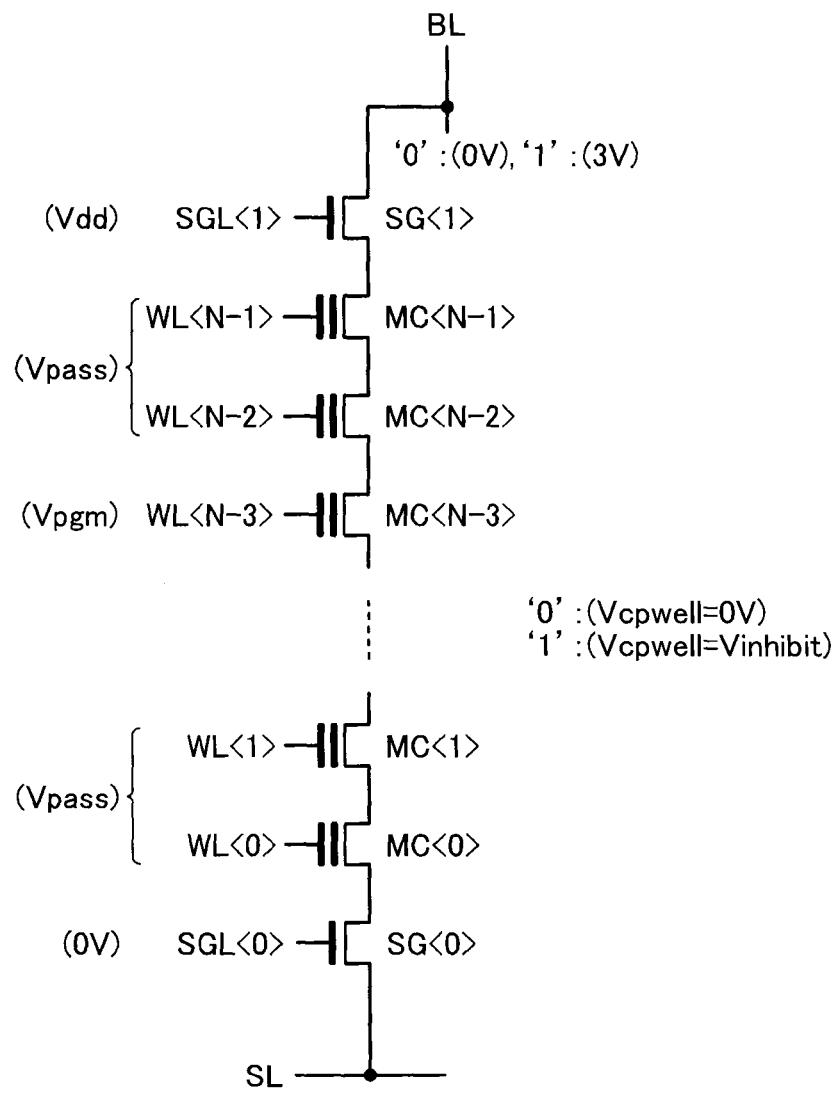
FIG. 4 is a view showing a bias state of the cell array during a program operation in the nonvolatile semiconductor memory device according to the same embodiment.

FIG. 4 is a view showing a bias state of the cell array during the program operation in the nonvolatile semiconductor memory device according to the present embodiment. FIG. 4 is an example of the case where the memory cell MC<N−3> is assumed to be a selected memory cell.

The program operation is an operation causing a memory cell MC in the erase state to undergo transition to the program state.

In the case of causing the memory cell MC to undergo transition to the program state, the cell well is set to, for example, a voltage Vcpwell=0 V, the select gate line SGL<0> is applied with, for example, 0 V, the select gate line SGL<1> is applied with, for example, a power supply voltage Vdd, and the bit line BL is applied with, for example, 0 V. In addition, an unselected word line WL is applied with a pass voltage Vpass (for example, 10 V), and a selected word line WL<N−3> is applied with a program voltage Vpgm (for example, 20 V). Hence, a large potential difference occurs between the cell well and the selected word line WL<N−3>, and electrons are injected into the floating gate of the selected memory cell MC<N−3>. As a result, the threshold voltage Vth of the selected memory cell MC<N−3> rises, whereby the selected memory cell MC<N−3> attains the program state.

In the case of not causing the memory cell MC to undergo transition to the program state, the select gate line SGL<0> is applied with, for example, 0 V, the select gate line SGL<1> is applied with the power supply voltage Vdd, and the bit line BL is applied with, for example, 3 V. In addition, the unselected word line WL is applied with the pass voltage Vpass, and the selected word line WL<N−3> is applied with the program voltage Vpgm (for example, 20 V). In this case, the voltage Vcpwell of the cell well rises to a certain inhibit voltage Vinhibit due to the influence of coupling with the word line WL. Hence, a large potential difference does not occur between the cell well and the selected word line WL<N−3>, and injection of electrons into the floating gate of the selected memory cell MC<N−3> is inhibited. As a result, the selected memory cell MC<N−3> is maintained unchanged in the erase state, without its threshold voltage Vth undergoing transition.

One example of the program operation in the case where data of two or more bits is stored by the memory cell will now be described.

Figure 5:
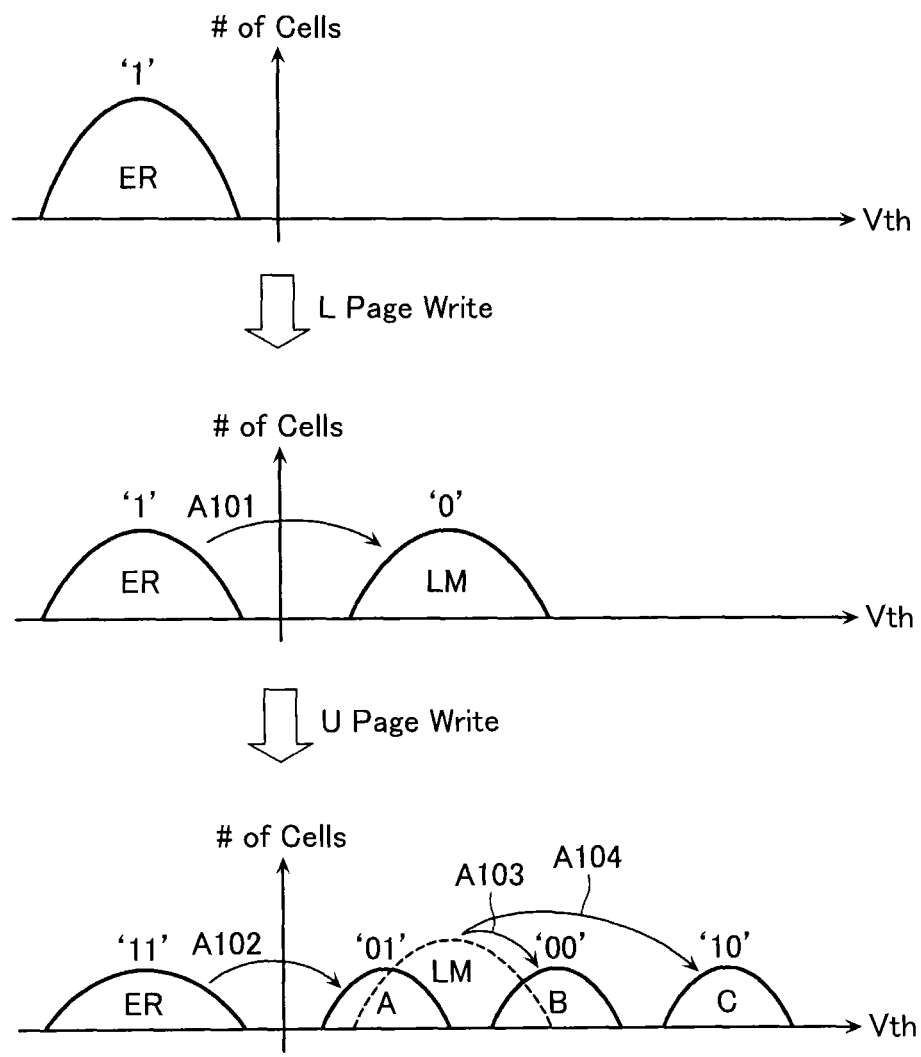
FIG. 5 is a view showing a state of transition of the threshold voltage distributions of the memory cell during a write sequence in the case of employing a two bits per cell memory cell in the nonvolatile semiconductor memory device according to the same embodiment.

FIG. 5 is a view showing a state of transition of the threshold voltage distributions of the memory cell during the write sequence in the case of employing a two bits per cell memory cell in the nonvolatile semiconductor memory device according to the present embodiment.

In the case of two bits per cell, the memory cell MC has four threshold voltage distributions, that is, a threshold voltage distribution of an ER level which is the erase state, and threshold voltage distributions of an A level, a B level, and a C level which are the program state, and respectively allocates, for example, '11' data, '01' data, '00' data, and '10' data to these threshold voltage distributions to store four values.

The program operation in the case of two bits per cell is executed in stages, for each layer of bit, on the memory cell MC rendered in the ER level beforehand as previously mentioned.

First, an L page write that programs based on a lower bit of write data is executed. In the L page write, the threshold voltage Vth of the memory cell MC whose lower bit of data to-be-written is '0' is once caused to undergo transition from the ER level to an LM level which is an intermediate level of the A level and the B level (arrow A101).

Following this, a U page write that programs based on an upper bit of the write data is executed. In the U page write, in the case that the threshold voltage Vth of the memory cell MC is the ER level, if the upper bit is '1', then the threshold voltage Vth is maintained at the ER level, and if the upper bit is '0', then the threshold voltage Vth is caused to undergo transition to the A level (arrow A102). On the other hand, in the case that the threshold voltage Vth of the memory cell MC is the LM level, if the upper bit is '0', then the threshold voltage Vth is caused to undergo transition to the B level (arrow A103), and if the upper bit is '1', then the threshold voltage Vth is caused to undergo transition to the C level (arrow A104).

The above is the program operation in the case of employing a two bits per cell memory cell.

Note that even when employing a memory cell MC that stores data of three or more bits, data can be written to the memory cell MC by executing the program operation for each layer of bit.

Next, an erase operation of a comparative example to the present embodiment will be described as a premise of describing the erase operation of the present embodiment.

Figure 6:
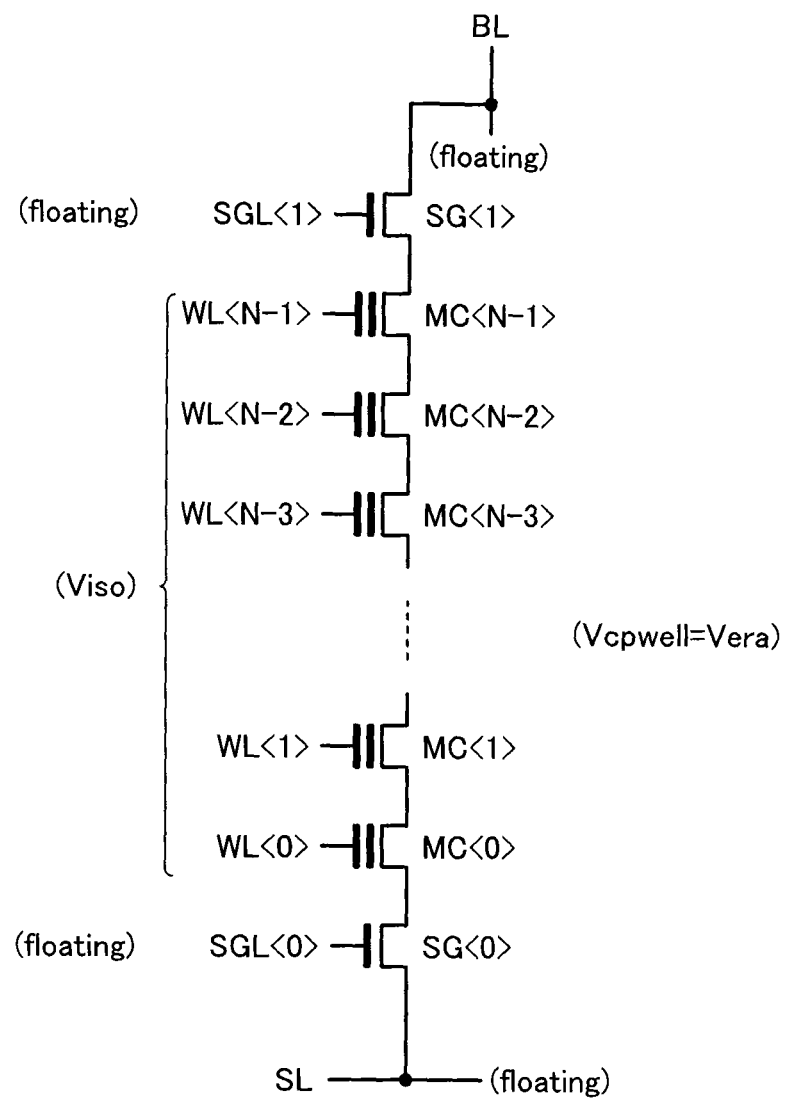
FIG. 6 is a view showing a bias state of a cell array during an erase operation in a nonvolatile semiconductor memory device according to a comparative example to the same embodiment.

FIG. 6 is a view showing a bias state of a cell array during the erase operation in a nonvolatile semiconductor memory device according to the present comparative example.

The erase operation is an operation causing a memory cell MC to undergo transition to the erase state.

In the case of causing the memory cell MC to undergo transition to the erase state, the select gate lines SGL<0> and SGL<1> and the bit line BL are set to a floating state. In addition, the cell well is set to an erase voltage Vcpwell=Vera (15 to 20 V), and all of the word lines WL are applied with a control voltage Viso (0.5 V). Hence, electrons are extracted from the floating gate of all of the memory cells MC. As a result, the threshold voltage Vth of all of the memory cells MC lowers, whereby all of the memory cells MC attain the erase state.

Note that the control voltage employed in the erase operation may be Viso=0 V. However, applying a positive voltage as the control voltage Viso as in the example of FIG. 6 makes it possible to improve cut-off characteristics of a transfer gate-dedicated transistor supplying the control voltage Viso provided between the row decoder/word line driver 2a and each of the blocks BLK. As a result, the transfer-dedicated transistor corresponding to an unselected block BLK can be cut off more reliably than in the case where the control voltage is Viso=0 V, hence a mistaken erase of the unselected block BLK can be suppressed.

Next, the read operation of the present embodiment will be described.

Figure 7:
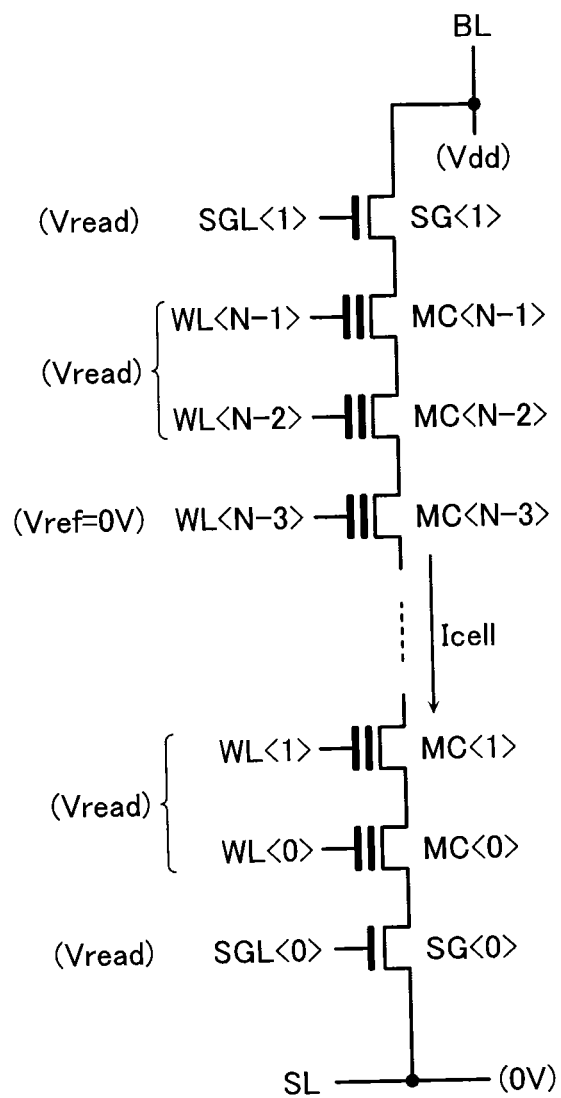
FIG. 7 is a view showing a bias state of the cell array during a read operation in the nonvolatile semiconductor memory device according to the same embodiment.

FIG. 7 is a view showing a bias state of the cell array during the read operation in the nonvolatile semiconductor memory device according to the present embodiment. FIG. 7 is an example of the case where the memory cell MC<N−3> is assumed to be the selected memory cell.

In the case of reading data from the memory cell MC, the bit line BL is pre-charged to the power supply voltage Vdd, the source line SL is applied with, for example, 0 V, the select gate lines SGL<0> and SGL<1> and the unselected word line WL are applied with a read pass voltage Vread (for example, 4.5 V), and the selected word line WL<N−3> is applied with a reference voltage Vref (for example, 0 V). As a result, if the threshold voltage of the selected memory cell MC<N−3> is Vth<0 V, then all of the transistors of the cell string CS including the selected memory cell MC<N−3> attain an on state, and a cell current Icell flows from the bit line BL to the source line SL. On the other hand, if the threshold voltage of the selected memory cell MC<N−3> is Vth>0 V, then the transistor of the selected memory cell MC<N−3> attains an off state, hence the cell current Icell does not flow in the cell string CS. The control unit detects presence/absence of the cell current Icell flowing in the bit line BL by the sense amplifier circuit SA, thereby determining the threshold voltage Vth of the memory cell MC.

Next, the program verify operation of the present embodiment will be described.

The program verify operation is the same as the above-described read operation excluding the selected word line WL being applied with a verify voltage Vvfy (for example 0.5 V). Now, the verify voltage Vvfy is a voltage of a lower limit of the threshold voltage distribution of the program state. Employing this verify voltage Vvfy makes it possible to find out whether the threshold voltage of the memory cell MC is Vth>Vvfy, whereby it can be confirmed whether the memory cell MC has undergone transition to the program state.

Next, the erase verify operation of the present embodiment will be described.

The erase verify operation is an operation confirming whether all of the memory cells MC of the block BLK have been caused to undergo transition to the erase state by the erase operation.

Figure 8:
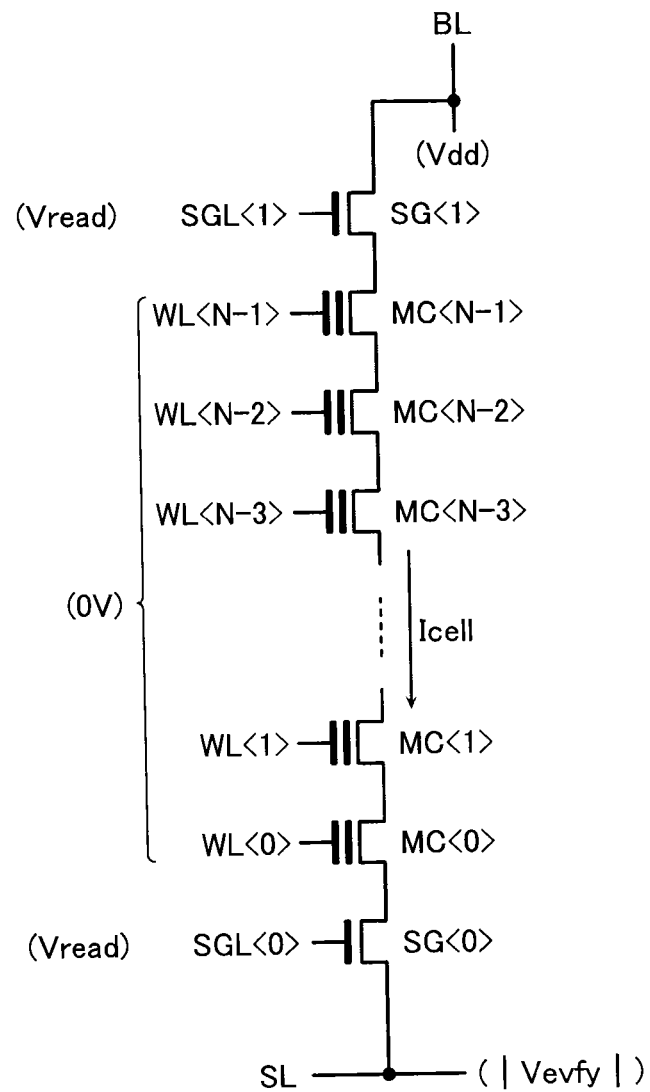
FIG. 8 is a view showing a bias state of the cell array during an erase verify operation in the nonvolatile semiconductor memory device according to the same embodiment.

FIG. 8 is a view showing a bias state of the cell array during the erase verify operation in the nonvolatile semiconductor memory device according to the present embodiment.

It is possible to employ, for example, a so-called negative sensing system erase verify operation in confirmation of whether the memory cell MC is in the erase state. In other words, the bit line BL is pre-charged to the power supply voltage Vdd, and the source line SL is applied with a positive voltage (for example, 1.0 V) having the same magnitude as an erase verify voltage Vevfy (for example, −1.0 V). Now, the erase verify voltage Vevfy is a voltage of an upper limit of the threshold voltage distribution of the erase state. In addition, the select gate lines SGL<0> and SGL<1> are applied with the read pass voltage Vread, and all of the word lines WL are applied with, for example, 0 V as a reference voltage. As a result, if the threshold voltage of all of the memory cells MC is Vth<Vevfy, then all of the transistors of the cell string CS attain an on state, and a cell current Icell flows from the bit line BL to the source line SL. On the other hand, if the threshold voltage of at least some of the memory cells MC is Vth>Vevfy, then the transistors of said memory cells MC attain an off state, hence the cell current Icell does not flow in the cell string CS. The control unit detects presence/absence of the cell current Icell flowing in the bit line BL by the sense amplifier circuit SA, whereby it can be confirmed whether all of the memory cells MC have undergone transition to the erase state.

The above is the method of operating the nonvolatile semiconductor memory device.

However, in the case of the above-described method of operating, the following kinds of problems occur.

Figure 9:
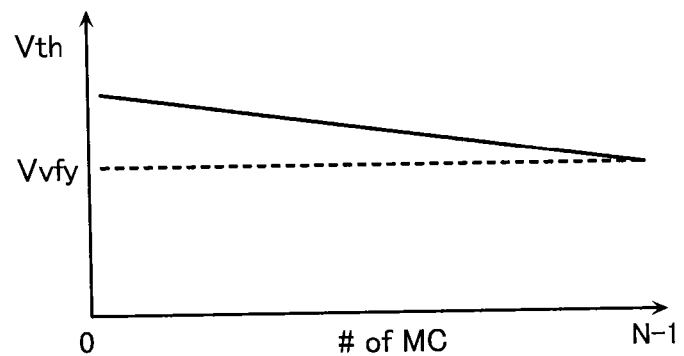
FIG. 9 is a graph showing a relationship between position of the memory cell and threshold voltage of the memory cell after the write sequence in the nonvolatile semiconductor memory device according to the same embodiment.
Figure 10:
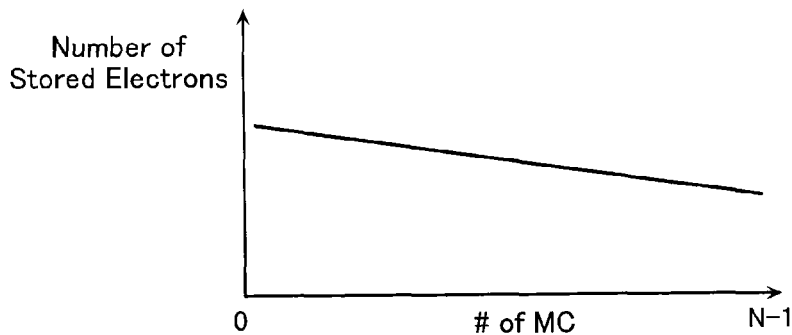
FIG. 10 is a graph showing a relationship between position of the memory cell and number of stored electrons of the memory cell after the write sequence in the nonvolatile semiconductor memory device according to the same embodiment.

FIG. 9 is a graph showing a relationship between position of the memory cell and threshold voltage of the memory cell after the write sequence in the nonvolatile semiconductor memory device according to the present embodiment. Moreover, FIG. 10 is a graph showing a relationship between position of the memory cell and number of stored electrons of the memory cell after the write sequence in the nonvolatile semiconductor memory device according to the present embodiment.

In the present embodiment, when writing data to one block BLK, the above-described write sequence targeting each of the memory cells MC is executed sequentially from the memory cell MC<0> disposed on a source line SL side.

In this case, when the write sequence on a certain memory cell MC is executed, the program of the memory cell MC more on the source line SL side than the certain memory cell MC has already been completed, leading to a state that it is proportionately more difficult for the cell current Icell to flow in the cell string CS. In other words, it becomes easier for the selected memory cell MC far from the source line SL than for the memory cell MC closer to the source line SL than that selected memory cell MC to pass the verify. As a result, as shown in FIG. 9, the threshold voltage Vth of the memory cell after the write sequence becomes lower the further the memory cell is from the source line SL. As shown in FIG. 10, this means that the number of stored electrons of the floating gate of the memory cell MC becomes fewer the further the memory cell MC is from the source line SL.

Dividing the cell string CS into a plurality of memory cell groups MCG configured from a certain number of the memory cells MC and performing operations in units of the memory cell group, will now be considered.

In the present embodiment, it is considered to divide the cell string CS into two memory cell groups MCG<0> and MCG<1>. Now, the memory cell group MCG<0> is a memory cell group disposed closer to the source line SL than is the memory cell group MCG<1> and becomes a target of the write sequence earlier than does the memory cell group MCG<1>. In this case, according to the graphs of FIGS. 9 and 10, the threshold voltage Vth after the write sequence is higher and the number of stored electrons of the floating gate after the write sequence is also greater in the memory cell group MCG<0> than in the memory cell group MCG<1>.

Next, the case of executing the erase sequence of the comparative example assuming the above-described characteristics of the write sequence, will be considered.

Figure 11:
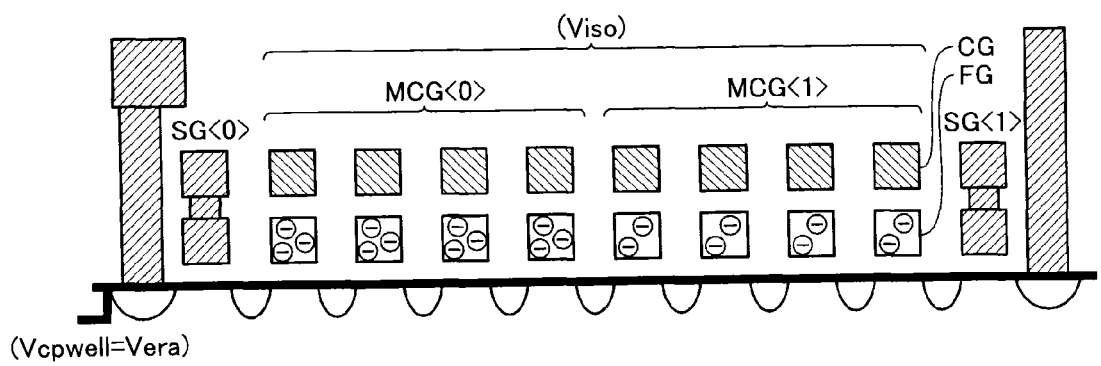
FIG. 11 is a view showing a bias state of the cell array and a state of stored electrons of a memory cell during the erase operation in the nonvolatile semiconductor memory device according to the same comparative example.
Figure 12:
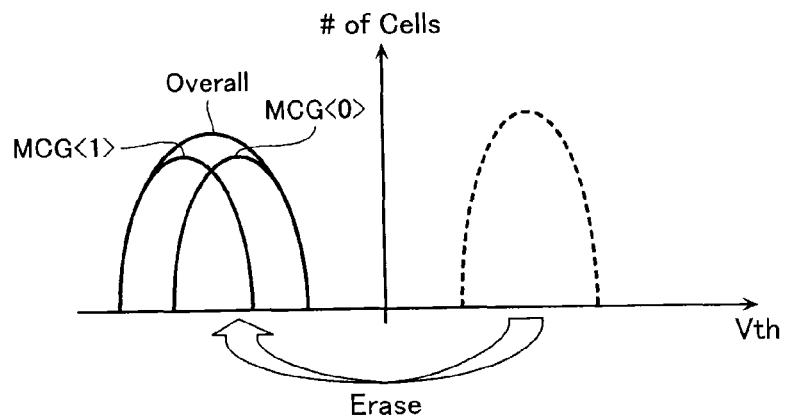
FIG. 12 is a graph showing a state of transition of threshold voltage distributions of the memory cell due to the erase sequence in the nonvolatile semiconductor memory device according to the same comparative example.

FIG. 11 is a view showing a bias state of the cell array and a state of stored electrons of the memory cell during the erase operation in the nonvolatile semiconductor memory device according to the present comparative example. FIG. 11 adopts eight memory cells MC in the cell string CS for simplification. Moreover, FIG. 12 is a graph showing a state of transition of threshold voltage distributions of the memory cell due to the erase sequence in the nonvolatile semiconductor memory device according to the present comparative example.

In the case of the erase operation of the comparative example, as shown in FIG. 11, all of the word lines WL are applied with the same control voltage Viso, regardless of the number of stored electrons of the floating gate FG. In this case, all of the memory cells MC are applied with the same electric field, and the same number of electrons are extracted. Therefore, the number of stored electrons of the memory cell group MCG<0> after the erase sequence becomes greater than the number of stored electrons of the memory cell group MCG<1> after the erase sequence. As a result, as shown in FIG. 12, the threshold voltage distributions after the erase sequence of the memory cell group MCG<0> and the memory cell group MCG<1> are different. Therefore, the overall threshold voltage distribution of the memory cell MC after the erase sequence ends up broadening.

Accordingly, in the present embodiment, the following kind of erase sequence is executed.

Figure 13:
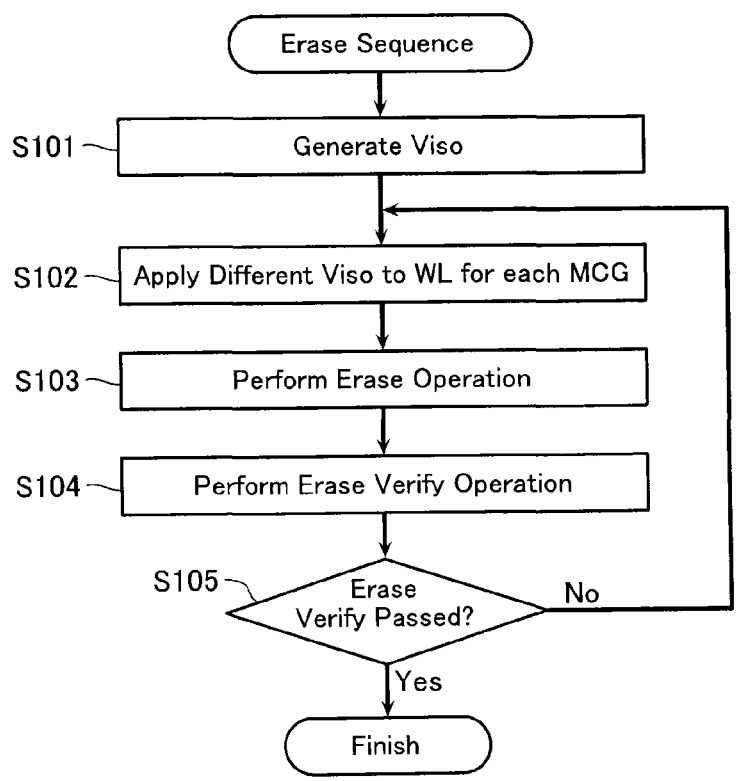
FIG. 13 is a flowchart of an erase sequence in the nonvolatile semiconductor memory device according to the same embodiment.
Figure 14:
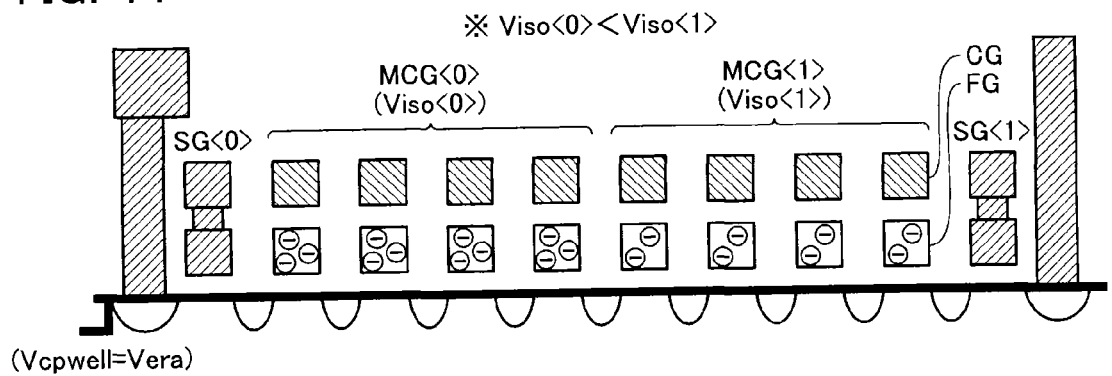
FIG. 14 is a view showing a bias state of the cell array and a state of stored electrons of the memory cell during an erase operation in the nonvolatile semiconductor memory device according to the same embodiment.

FIG. 13 is a flowchart of the erase sequence in the nonvolatile semiconductor memory device according to the present embodiment. Moreover, FIG. 14 is a view showing a bias state of the cell array and a state of stored electrons of the memory cell during the erase operation in the nonvolatile semiconductor memory device according to the present embodiment. FIG. 14 adopts eight memory cells MC in the cell string CS for simplification.

First, in step S101, the control voltage Viso applied to the word line WL is generated by the voltage generating circuit 8. In the case of the present embodiment, two different control voltages Viso<0> and Viso<1> are generated. Now, the control voltage Viso<0> is, for example, 0.5 V, and the control voltage Viso<1> is a voltage which is higher than the control voltage Viso<0> and is, for example, 1.5 V.

Following this, in step S102, the word line WL connected to the memory cell group MCG<0> is applied with the control voltage Viso<0>, and the word line WL connected to the memory cell group MCG<1> is applied with the control voltage Viso<1>.

Following this, in step S103, the cell well is set to the erase voltage Vcpwell=Vera (for example, 15 to 20 V), and the erase operation is executed. As a result, electrons are extracted from the floating gate of the memory cell MC.

Following this, in step S104, the erase verify operation described using FIG. 8 is executed. As a result, if all of the memory cells MC have passed the erase verify, then the erase sequence is completed (Yes of step S105). On the other hand, if at least some of the memory cells MC have not passed the erase verify, then the process is returned to step S102 (No of step S105).

The above is the erase sequence of the present embodiment.

Figure 15:
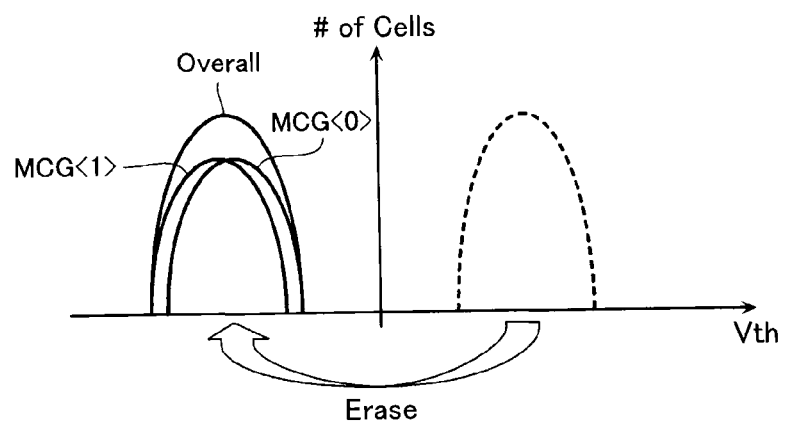
FIG. 15 is a graph showing a state of transition of the threshold voltage distributions of the memory cell due to the erase sequence in the nonvolatile semiconductor memory device according to the same embodiment.

FIG. 15 is a graph showing a state of transition of the threshold voltage distributions of the memory cell due to the erase sequence in the nonvolatile semiconductor memory device according to the present embodiment.

In the case of the erase operation of the present embodiment, as shown in FIG. 14, the word line WL connected to the memory cell group MCG<1> is applied with the control voltage Viso<1> which is higher compared to a voltage applied to the word line WL connected to the memory cell group MCG<0>. In other words, the closer that the memory cell group MCG is to the bit line BL and the later that the memory cell group MCG becomes a target of the write sequence, the higher is the control voltage Viso applied to the word line WL connected to that memory cell group MCG. Hence, an electric field applied to the memory cell group MCG<1> becomes weaker than an electric field applied to the memory cell group MCG<0>. As a result, the number of electrons extracted from the floating gate FG of the memory cell group MCG<1> can be reduced over that of the memory cell group MCG<0>. On the other hand, as shown in FIG. 14, the number of stored electrons of the memory cell MC after the write sequence is fewer for the memory cell MC of the memory cell group MCG<1> than for the memory cell MC of the memory cell group MCG<0>. Therefore, as a result, the numbers of stored electrons of the memory cell groups MCG<0> and MCG<1> after the erase sequence can be set to the same level. In other words, as shown in FIG. 15, a difference in the threshold voltage distributions of the memory cell groups MCG<0> and MCG<1> after the erase sequence can be reduced and as a result, broadening of the overall threshold voltage distribution of the memory cell MC can be reduced, compared to in the comparative example.

Note that the "memory cell (memory cell group) that becomes a target of the write sequence later" mentioned here refers to a memory cell group whose order of becoming a target of the write sequence programming the same layer of bit is later. For example, in the case of two bits per cell, the memory cell MC<n> is sometimes also programmed after the memory cell MC<n+1>, in the manner of L page write to memory cell MC<n>→L page write to memory cell MC<n+1>→U page write to memory cell MC<n>, but in this case also, since the order of becoming a target of the L page write is considered, the memory cell MC<n+1> turns out to be the later-programmed memory cell. In other words, a later-programmed memory cell of the memory cells MC written with data of an identical number of bits corresponds to the "memory cell that becomes a target of the write sequence later".

As is clear from the above, the present embodiment makes it possible to provide a nonvolatile semiconductor memory device in which broadening of the threshold voltage distribution after data erase of the memory cell is suppressed, and a method of operating the same.

Second Embodiment

In a second embodiment, modified examples of the first embodiment will be described.

Figure 16:
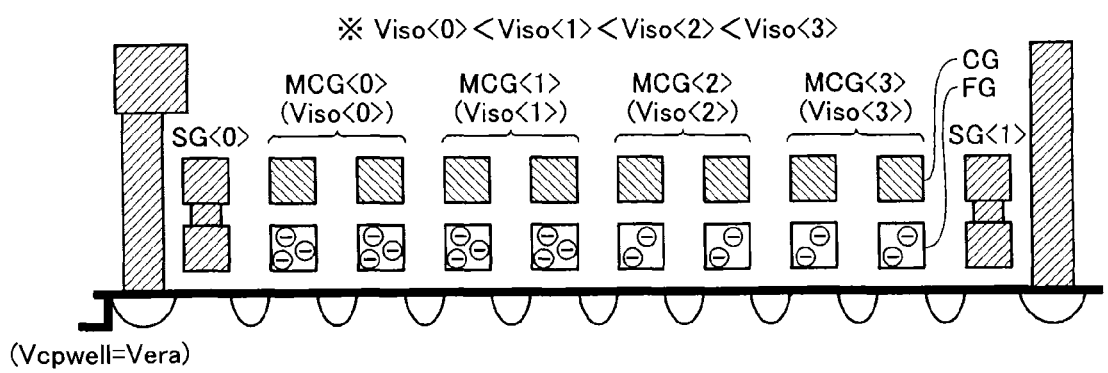
FIG. 16 is a view showing a bias state of a cell array and a state of stored electrons of a memory cell during an erase operation in a nonvolatile semiconductor memory device according to a second embodiment.
Figure 17:
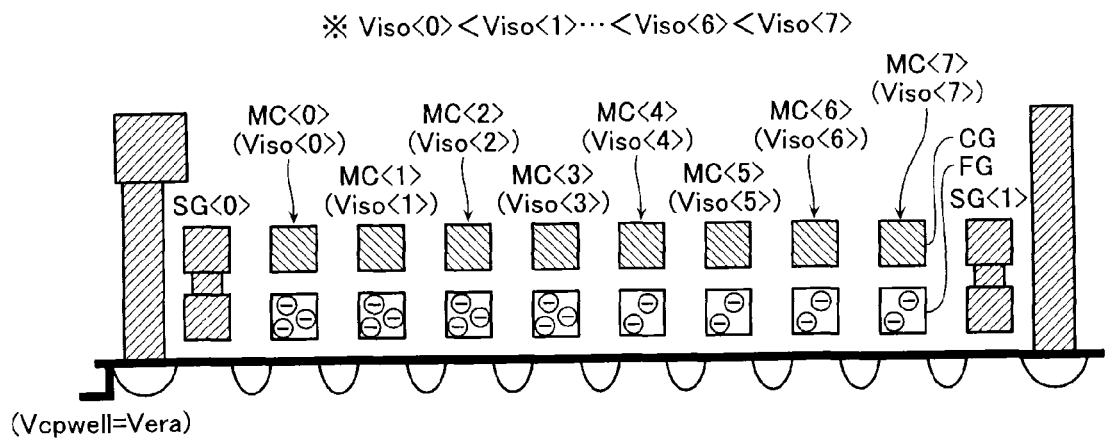
FIG. 17 is a view showing a bias state of the cell array and a state of stored electrons of the memory cell during the erase operation in the nonvolatile semiconductor memory device according to the same embodiment.

FIGS. 16 and 17 are views each showing a bias state of a cell array and a state of stored electrons of a memory cell during an erase operation in a nonvolatile semiconductor memory device according to the second embodiment. FIGS. 16 and 17 adopt eight memory cells MC in a cell string CS for simplification.

In the first embodiment, the cell string CS was divided into the two memory cell groups MCG<0> and MCG<1>, and the erase operation was executed with an identical bias state within each of the memory cell groups MCG. However, as shown in FIG. 10, the number of stored electrons of the memory cell MC after the write sequence decreases gradually with increasing distance from the source line SL, and does not decrease stepwise in units of the memory cell group MCG. Accordingly, in the present embodiment, the number of divisions of the cell string CS is increased, and the threshold voltages of the memory cell groups after the erase sequence are more precisely aligned.

FIG. 16 is an example where the cell string CS is divided into four memory cell groups MCG<0> to MCG<3>. The four memory cell groups are disposed in order of MCG<0>, MCG<1>, MCG<2>, and MCG<3> from the source line SL side. In this example, the word lines WL connected to the memory cell groups MCG<0> to MCG<3> are applied with control voltages Viso<0> to Viso<3>, respectively, during the erase operation. These four control voltages have a relationship that Viso<0> (for example, 0.5 V)<Viso<1> (for example, 0.8 V)<Viso<2> (for example, 1.1 V)<Viso<3> (for example, 1.4 V). In other words, the later that the memory cell group MCG becomes a target of the write sequence, the higher is the control voltage Viso applied to the word line WL connected to that memory cell group MCG.

FIG. 17 is an example where one memory cell MC is adopted as one memory cell group MCG. In this example, the word lines WL connected to memory cells MC<0> to MC<7> are applied with control voltages Viso<0> to Viso<7>, respectively, during the erase operation. These control voltages have a relationship that Viso<0> (for example, 0.5 V)<Viso<1> (for example, 0.6 V)<Viso<2> (for example, 0.7 V)<Viso<3> (for example, 0.8 V)<Viso<4> (for example, 0.9 V)<Viso<5> (for example, 1.0 V)<Viso<6> (for example, 1.1 V)<Viso<7> (for example, 1.2 V). In other words, the later that the memory cell group MCG becomes a target of the write sequence, the higher is the control voltage Viso applied to the word line WL connected to that memory cell group MCG.

If the cell string is divided into a larger number of memory cell groups in this way, it is possible to apply a more appropriate electric field that accords with differences in the numbers of stored electrons of each of the memory cells MC, in the erase operation. As a result, a difference in threshold voltage distributions of the memory cell groups after the erase sequence can be further reduced compared to in the first embodiment.

As is clear from the above, the present embodiment makes it possible to provide a nonvolatile semiconductor memory device in which broadening of the threshold voltage distribution of the memory cell after data erase of the memory cell is even more suppressed than in the case of the first embodiment, and a method of operating the same.

Note that in the case of increasing the number of divisions of the cell string, there is a need to prepare a proportionately larger number of control voltages, hence there is a risk that circuit scale increases and control becomes complex. Therefore, it is desirable to select an appropriate number of divisions of the cell string based on a specification of a product.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a cell array including a bit line, a plurality of word lines and a source line that intersect the bit line, and a cell string electrically connected between the bit line and the source line, the cell string including a plurality of memory cells connected to each other in series, each of the memory cells being configured from a transistor having a structure in which a charge accumulation layer and a control gate which is connected to one of the word lines are stacked on a semiconductor substrate via an insulating film; and
   a control unit that performs a data write/erase on the memory cell,
   the control unit, during the data erase, applying at least to the word line connected to the memory cell disposed most to a source line side a lower control voltage than that applied to the word line connected to the memory cell disposed most to a bit line side, of a plurality of the word lines connected to at least a plurality of the memory cells mutually written with data of an identical number of bits in the cell string.

2. The nonvolatile semiconductor memory device according to claim 1, wherein
   the control unit, during the data erase, executes an erase operation that divides at least the plurality of the memory cells mutually written with data of an identical number of bits in the cell string into a plurality of memory cell groups, that applies a higher control voltage to the word line connected to the memory cell group the closer the memory cell group is to the bit line and applies an erase voltage higher than the control voltage to the semiconductor substrate, and that thereby erases the data.

3. The nonvolatile semiconductor memory device according to claim 1, wherein
   the control unit, during the data erase, executes after the erase operation an erase verify operation that confirms whether data of the plurality of memory cells has been erased, based on a current flowing in the cell string from the bit line toward the source line.

4. The nonvolatile semiconductor memory device according to claim 3, wherein
   the control unit, during the erase verify operation of the data erase, applies a reference voltage to the plurality of word lines, and applies a positive voltage to the source line.

5. The nonvolatile semiconductor memory device according to claim 4, wherein
   the control unit, during the erase verify operation of the data erase, employs the reference voltage of 0 V.

6. The nonvolatile semiconductor memory device according to claim 1, wherein
   the cell array includes a plurality of the cell strings sharing the plurality of word lines, and
   the control unit executes the data write in a unit of a page configured from a plurality of the memory cells connected to one of the word lines, and executes the data erase in a unit of a block configured from the plurality of cell strings sharing the plurality of word lines.

7. The nonvolatile semiconductor memory device according to claim 6, wherein
   the control unit, during the data write, programs in order from the memory cell disposed on the source line side.

8. The nonvolatile semiconductor memory device according to claim 1, wherein
   at least some of the plurality of memory cells store data of two or more bits.

9. The nonvolatile semiconductor memory device according to claim 8, wherein
   the control unit, during the data write, performs a program of the same layer of bit targeting the memory cell disposed on the bit line side later than the memory cell disposed on the source line side.

10. The nonvolatile semiconductor memory device according to claim 2, wherein
    the plurality of memory cell groups are configured by mutually identical numbers of memory cells.

11. The nonvolatile semiconductor memory device according to claim 2, wherein
    the control unit, during the erase operation of the data erase, applies a positive control voltage to a plurality of the word lines.

* * * * *